United States Patent [19]

Long et al.

[11] Patent Number: 5,087,961
[45] Date of Patent: Feb. 11, 1992

[54] SEMICONDUCTOR DEVICE PACKAGE

[75] Inventors: Jon Long, Livermore; Rachel S. Sidorovsky, San Jose, both of Calif.

[73] Assignee: LSI Logic Corporation, Milpitas, Calif.

[21] Appl. No.: 483,284

[22] Filed: Feb. 20, 1990

Related U.S. Application Data

[63] Continuation of Ser. No. 115,228, Oct. 30, 1987, abandoned, which is a continuation-in-part of Ser. No. 8,208, Jan. 28, 1987, and a continuation-in-part of Ser. No. 49,641, May 13, 1987.

[51] Int. Cl.⁵ .................... H01L 23/48; H01L 23/28; H01L 39/02
[52] U.S. Cl. ........................ 357/69; 357/70; 357/72; 357/80; 174/52.4
[58] Field of Search ............ 357/68, 69, 70, 80, 357/72; 174/52.4

[56] References Cited

U.S. PATENT DOCUMENTS 3,811,183  5/1974  Celling ................. 437/211
4,867,686  9/1989  Goldstein ............. 434/267

FOREIGN PATENT DOCUMENTS

| 0001153 | 1/1980 | Japan | 357/80 |
| 0138042 | 8/1983 | Japan | 437/211 |
| 0159547 | 9/1984 | Japan | 437/211 |
| 0136346 | 7/1985 | Japan | 357/80 |
| 0008531 | 1/1987 | Japan | 437/211 |

Primary Examiner—Eugene R. LaRoche
Assistant Examiner—Michael Shingleton
Attorney, Agent, or Firm—Skjerven, Morrill, MacPherson, Franklin & Friel

[57] ABSTRACT

A semiconductor device assembly is made without a molded package by using a tape having a patterned insulating layer and a conductive layer joined thereto. A semiconductor die is seated on the conductive layer and electrically connected to leads of the patterned conductive layer. A body frame is positioned around the die and electrical leads and connections, and an encapsulant material is distributed over the frame and within the frame over the die and electrical leads and connections.

1 Claim, 8 Drawing Sheets

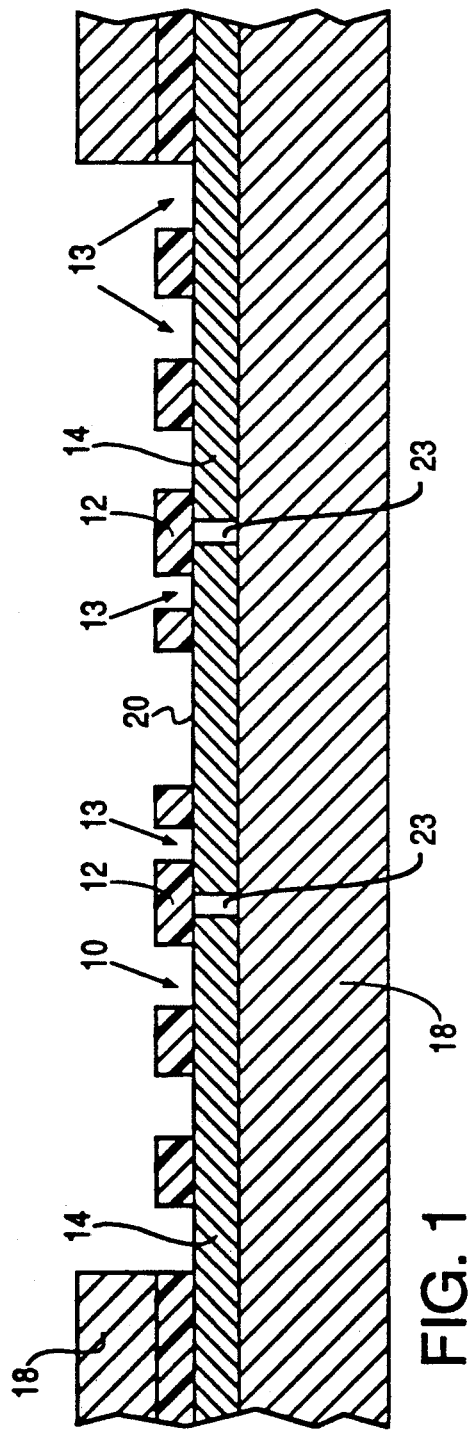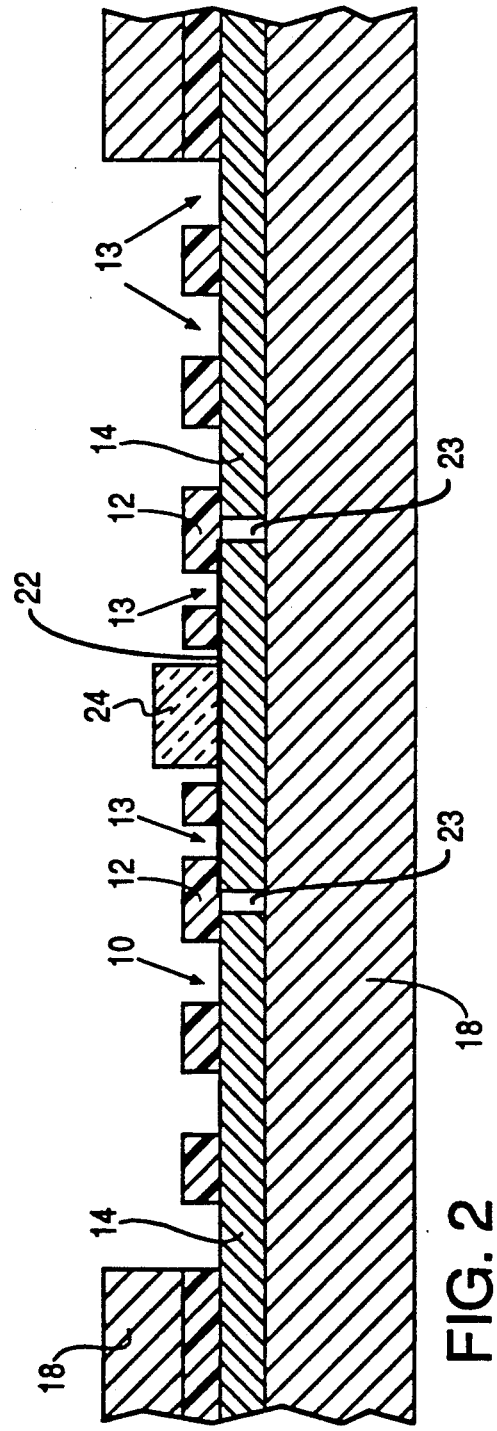

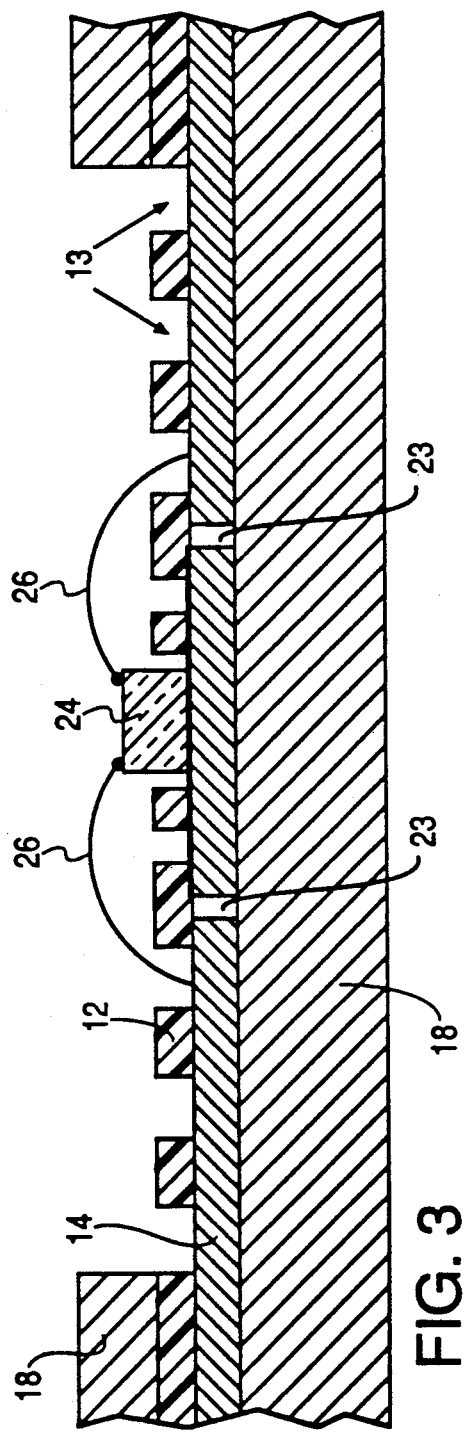
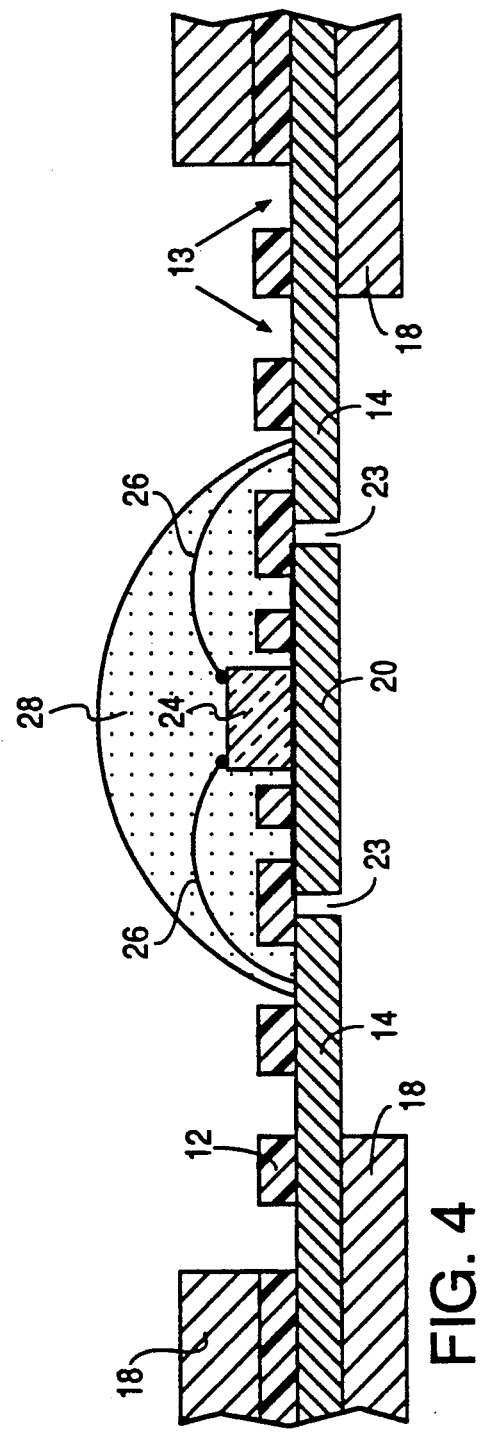

SEMICONDUCTOR DEVICE PACKAGE

This application is a continuation of application Ser. No. 07/115,228 filed Oct. 30, 1987, now abandoned.

The application (Ser. No. 07/115,228) is a continuation-in-part of the below-referenced copending applications (07/008,208 filed Jan. 28, 1987 and 07/049,641 filed May 13, 1987).

CROSS-REFERENCE TO COPENDING U.S. PATENT APPLICATION

Copending U.S Pat. application Ser. No. 07/008,208, filed Jan. 28, 1987, and assigned to the same assignee, which issued Jan. 24, 1989 as U.S. Pat. No. 4,800,419, discloses a support assembly for integrated circuits. Copending U.S. Pat. application Ser. No. 07/049,641, filed May 13, 1987, assigned to the and which issued Sept. 13, 1988 as same assignee, U.S. Pat. No. 4,71,330 discloses an integrated circuit device package wherein an insulating layer is etched and patterned. The subject matters of the copending patent applications are incorporated herein for reference.

FIELD OF THE INVENTION

This invention relates to a method and means of fabricating a semiconductor device package.

BACKGROUND OF THE INVENTION

Prior art semiconductor device packages are fabricated in a sandwich mold configuration wherein the semiconductor device is encapsulated forming a package on both sides of the die. When the package is cooled after the molding process, the larger molded package tends to curl, which results in a defective or unusable device. Also, if the package has any minute openings or cracks that allow moisture to penetrate to the elements of the semiconductor device, delamination of the semiconductor die can occur, which will render the device defective, or will cause the device to have a reduced operating life. Furthermore, the use of a mold to construct the package increases the height and area of the package significantly.

A composite package assembly, such as disclosed in the aforementioned copending patent applications, is formed with a rigid lead frame and a thin flexible tape-like structure. The tape-like structure is configured with lead fingers that are connected to leads of the lead frame. The semiconductor assembly, which includes bond wires, is encapsulated using a two section mold that requires a number of molding steps to encompass the semiconductor device with the lead frame, tape-like structure, bond wires and conductive leads.

Conventional semiconductor molded packages which are standard in the semiconductor industry accommodate up to 160 conductive leads, which typically are spaced between 50 and 25 milli-inches from center to center. As the number of leads are increased, the number of bond wires that connect to the leads are increased accordingly. The increase in bond wires results in a larger package.

A major objective of the semiconductor industry is to make semiconductor devices with more conductive leads and yet to have a more compact package. With a more compact package, semiconductor die with more die pads can be used, which requires closer spacing of the leads of the semiconductor assembly. As a result, higher circuit operating speeds can be realized with improved operating reliability.

SUMMARY OF THE INVENTION

An object of this invention is to provide a novel and improved semiconductor package which eliminates the need for a molding process to form a plastic package body.

Another object of this invention is to provide a semiconductor package in which wire bonding can be eliminated.

Another object is to provide a semiconductor package that affords a relatively large number of conductive leads and external pins.

A further object is to provide a semiconductor package that affords a high degree of protection from moisture.

In accordance with this invention, a tape is formed of a patterned insulating layer and a conductive layer that is joined to the insulating layer. A semiconductor die is attached to a pad on one surface of the tape and electrically connected to leads of the conductive layer. An insulating coat is dispensed over the die and wire leads. At the surface opposite to the die attach pad, an insulating tape element is adhered to the conductive layer. A package frame or body frame is joined to the tape surrounding the semiconductor die and electrical connections and leads. The body frame serves to contain an encapsulant that is distributed over the top of the body frame, the die and conductive wires and leads.

In one embodiment, conductive bumps in lieu of wire leads are used for electrical connection Tab bonding is employed to join the bumps which are formed on the die and the conductive layer. As a result, the semiconductor device package is made more compact and accommodates an increased number of leads and external pins.

DESCRIPTION OF THE DRAWINGS

The invention will be described in greater detail with reference to the drawings in which:

FIG. 1 is a sectional side view of a semiconductor assembly, in part, made in accordance with this invention;

FIG. 2 depicts the attachment of a semiconductor die to the partial assembly of FIG. 1;

FIG. 3 illustrates the wire bonding of the die to conductive lead fingers of the assembly;

FIG. 4 shows the application of a protective coating over the semiconductor die and bond wires;

Similar numerals refer to similar elements throughout the drawing.

DETAILED DESCRIPTION OF THE INVENTION

Figure 5:
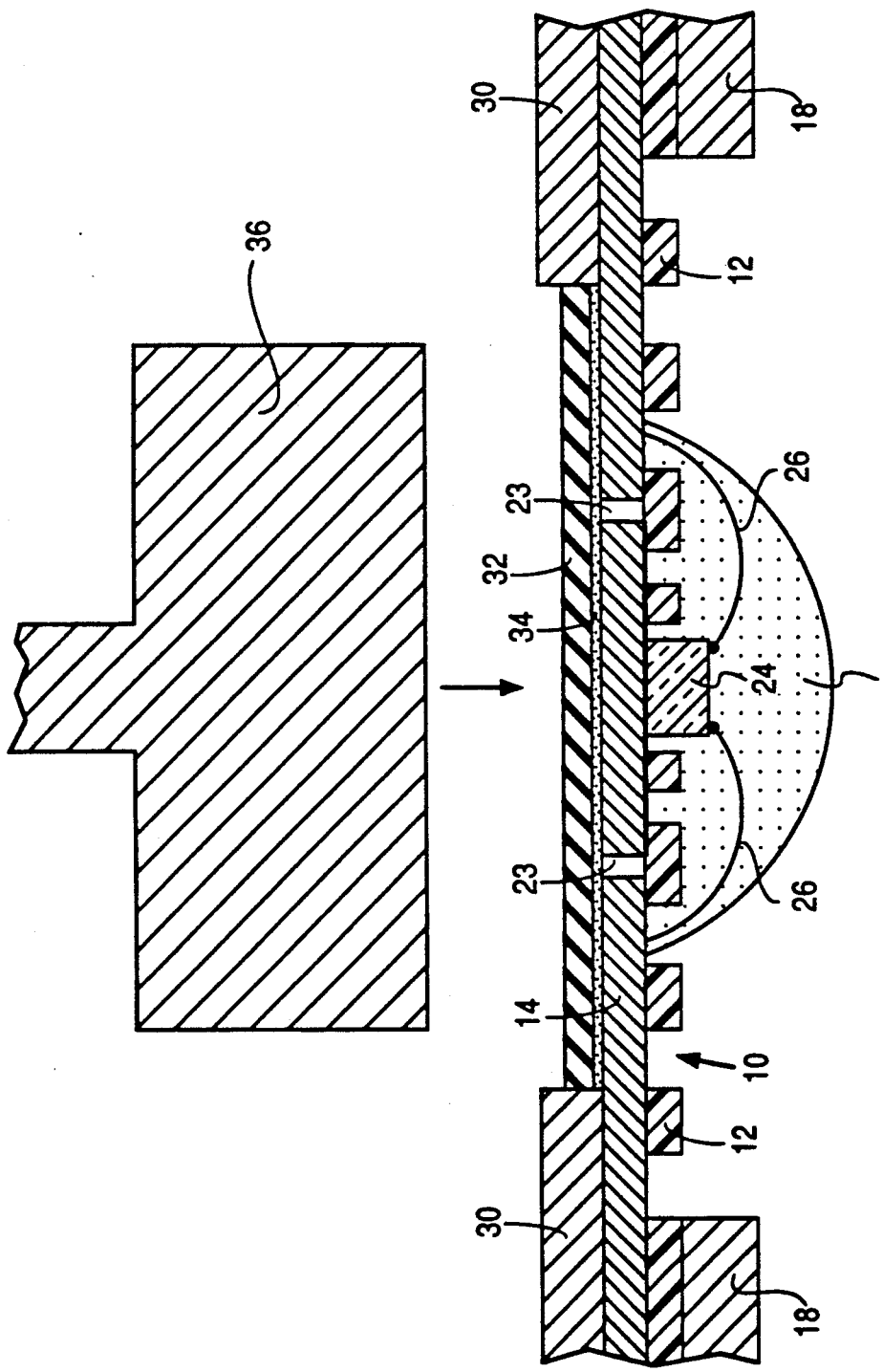
FIG. 5 illustrates the partial assembly, turned upside down, for attaching an aligned backside tape, in accordance with this invention.

With reference to FIG. 1, in an implementation of the invention, a wire bondable tape 10 is formed of a patterned insulating layer 12 made of Kapton (trademark of DuPont), for example, and a gold plate layer 14 that is joined to the Kapton layer. The gold plate layer is about 30–40 microinches thick, by way of example. The Kapton insulating layer 12 is etched and patterned with cavities 13 such as, for down bonding, as disclosed in U.S. Pat. application Ser. No. 07/049,641, filed on May 13, 1987, U.S. Pat. No. 4,711,330. Gold plate layer 14 is also patterned to have gaps 23 under "wedge" portions of the insulating layer 12 as disclosed in copending U.S. Pat. application Ser. No. 07/049,641.

The patterned wire bondable tape 10 is positioned in a fixture 18, to provide flatness to the tape 10. Die attach epoxy 22, such as Amicon 990C (trademark of Amicon) is spread on a die attach pad 20 formed on one surface of the wire bondable tape 10. A semiconductor die 24 is then aligned and placed on the die attach epoxy as illustrated in FIG. 2. The die attached unit is placed in an oven for curing at a maximum cure temperature of about 150° C. for a maximum cure time of about one hour.

The cured die attached unit is placed on a vacuum heater block (such as disclosed in copending U.S. Pat. application Ser. No. 07/043,894 filed Apr. 29, 1987 and issued De. 13, 1988 as U.S. Pat. No. 4,790,897) to hold the unit rigid and at a temperature of about 200° C. Then the unit is wire bonded thermosonically with gold wires 26 as shown in FIG. 3 to make electrical connection between the die 24 and lead fingers or conductive elements of the patterned gold layer 14. A silicone gel 28, such as Dow Corning Q1-4939, having a 1 to 10 mixing ratio of curing agent to its base is then applied as a die coat over the die, first starting in the corners and then distributing the gel in the middle of the die. The gel is permitted to flow to cover the die and wires (see FIG. 4) but is contained within a prescribed area, as disclosed in the aforementioned copending patent application Ser. No. 07/049,641 now U.S. Pat. No. 4,771,330. The die coated unit is then cured in an oven at about 150° C. for about one hour.

After the die coat cure, the unit is turned upside down and is positioned within an alignment fixture 30 as depicted in FIG. 5. The fixture 18 is used to protect the die, wires and die coat from damage. An insulating tape element 32 that has an adhesive 34 on one surface is set down on the lower surface or backside of the conductive layer 14 which is part of the wire bondable tape 10. A metal block 36 that has been preheated on a hot plate at a temperature in the range of 100–150° C. approximately is brought into contact with the tape element 32 for about 1 to 1.5 minutes to cause the adhesive 34 to flow and adhere to the backside of the conductive element 14, while the tape 10 is maintained in alignment. The fixture 30 is replaced by a fixture (not shown) having a wider window to ensure that the adhesive 34 will not stick to the fixture 30 during the curing process that follows. To accomplish the curing, the unit is placed in an oven with the die side or upper surface of the tape 10 facing down for about ½ hours at approximately 150° C..

Figure 6:
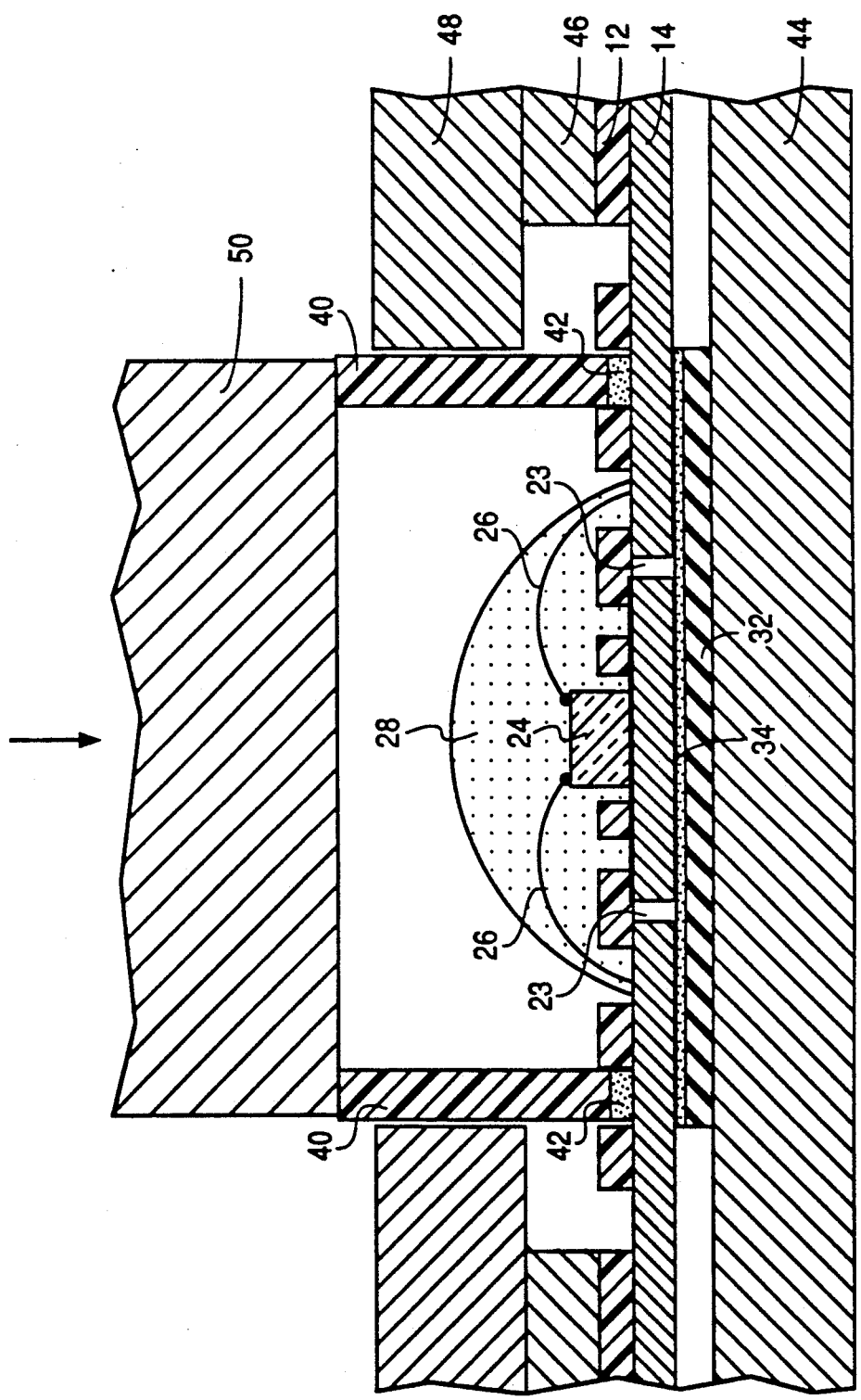
FIG. 6 illustrates the joinder of a frame body to the assembly.

In accordance with this invention, a package frame or body frame 40, preferably made of a polymer material such as Ryton (trademark of Phillips Chemical Co) is joined to the cured unit by means of an epoxy adhesive 42, which may be a B-stage adhesive such as RT-4B (trademark of RJR Polymers). The unit is inserted into a fixture or tray 44, as shown in FIG. 6 with the die facing up. An insert 46 is positioned on top of the unit, and an alignment fixture 48 is located on top of the insert. While the unit is maintained at a temperature between 120–150° C., the body frame 40 is placed into the alignment fixture 48 so that the adhesive 42 makes contact with the gold plate layer 14 and the tape element 32. A slight force is applied to the top perimeter of the frame by means of a block 50, as shown in FIG. 6. The pressure is applied to the frame for about 15–30 seconds. The unit with the attached frame is then 50° C. for approximately one hour.

Figure 7:
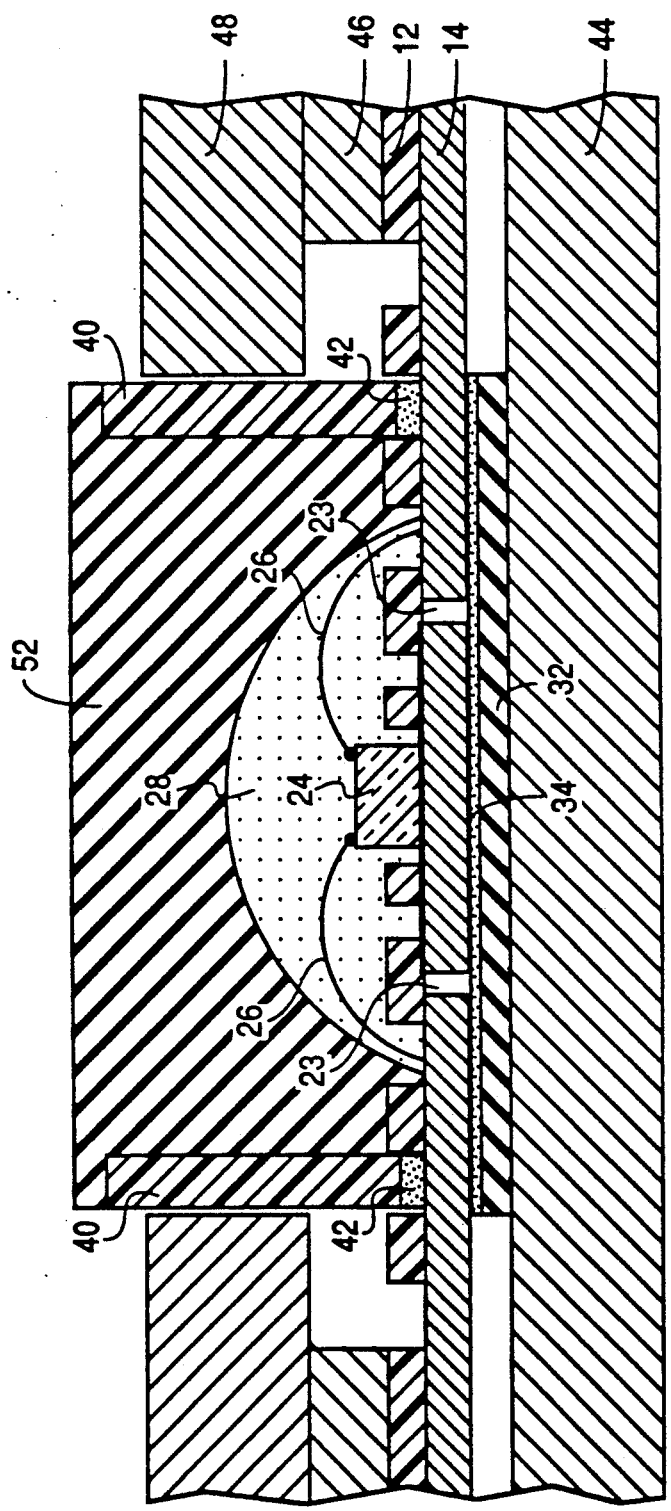
FIG. 7 is a sectional view of a semiconductor device package, made in accordance with this invention.

After the unit with the body frame cures, an electronic grade epoxy material 52, such as Hysol CNB 405-12 (trademark of Hysol) is used to encapsulate the device, while the temperature of the unit is maintained at about 50-70° C. The epoxy is distributed by a dispensing needle, for example, in a circular motion, starting at the perimeter or corners inside the body frame and moving to the center of the die area. The epoxy is made to flow evenly so that a substantially flat surface results and air bubbles are eliminated. The epoxy effectively encapsulates the top of the body frame and the elements contained within the frame, as shown in FIG. 7. The epoxy encapsulant is then cured by placing the unit in an oven for 2–4 hours at a temperature between 130° C. to 150° C..

Figure 8:
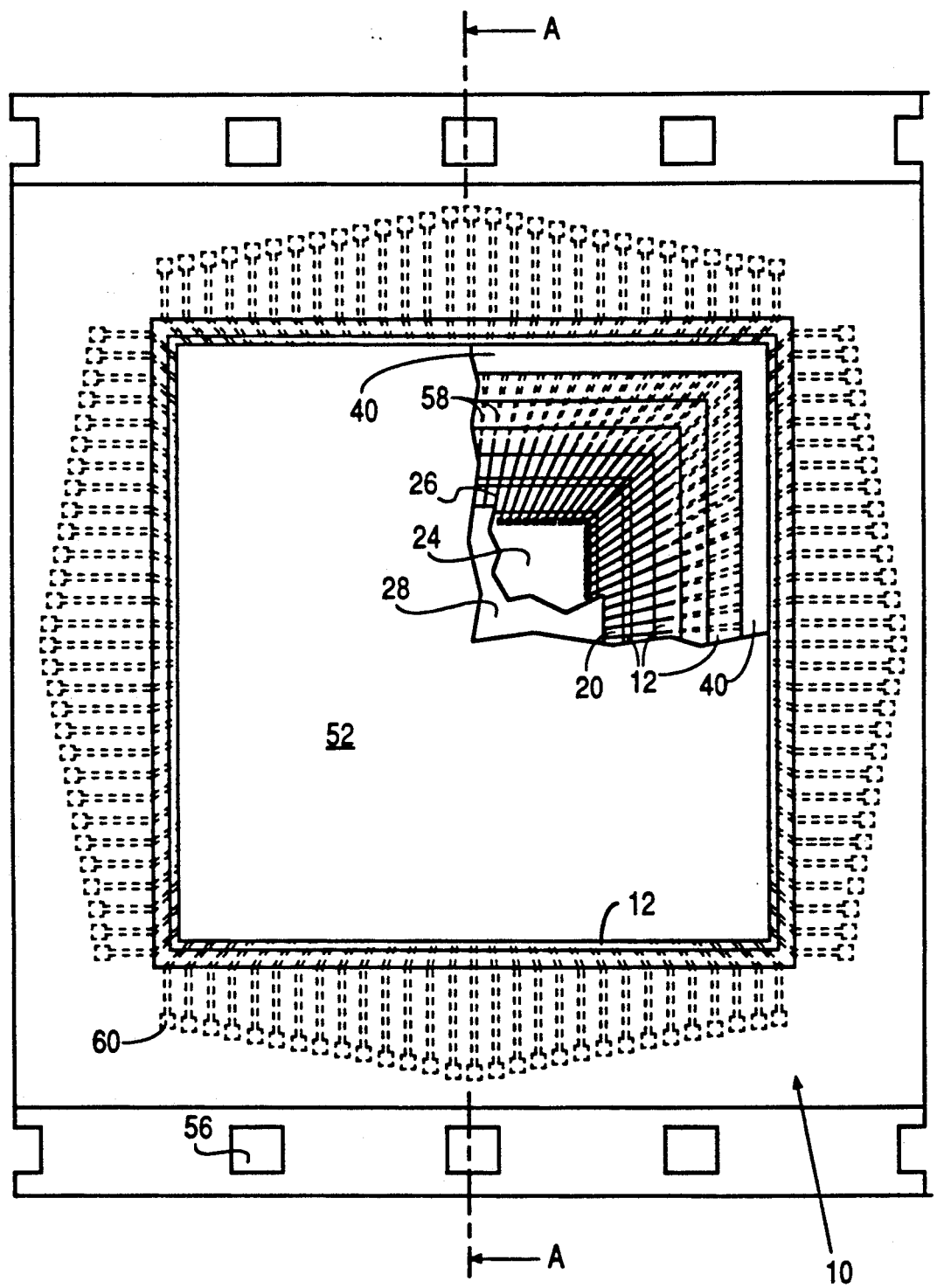
FIG. 8 is a top plan view, partly opened, depicting a semiconductor device package, made in accordance with this invention; line A—A of FIG. 8 represents a cut line along which sections of FIGS. 1-7 and 9 may be taken.

In the top plan view of FIG. 8, the novel semiconductor device package of this invention, the relationship of the body frame 40 to the patterned Kapton layer 12 is shown. Sprocket holes 56 are provided with the wire bondable tape 10 to aid in the automated processing of the tape. Bond fingers 58 couple the bond wires 26 to outer lead fingers to enable electrical connection to external connections or pins 60, as disclosed in the referenced copending applications.

Figure 9:
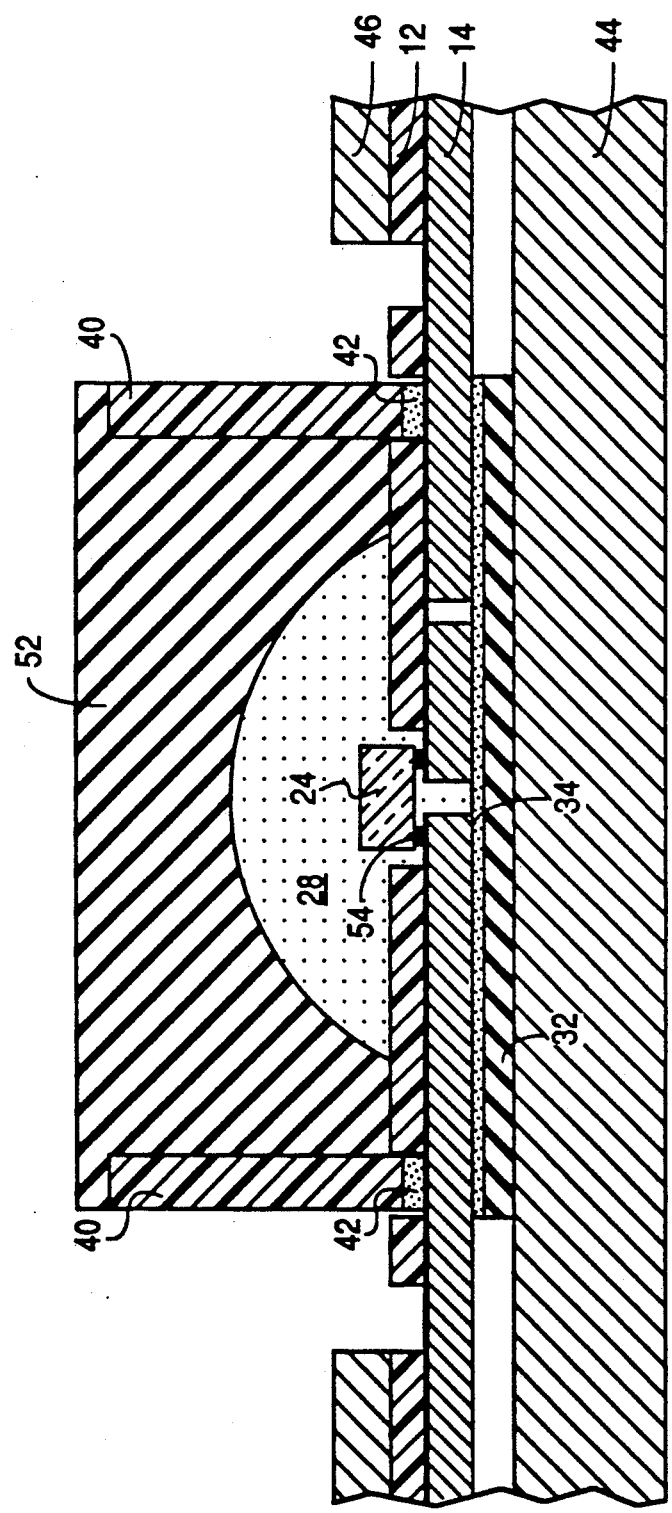
FIG. 9 is a sectional view of a semiconductor device package, using tape automated bonding (TAB), to join and electrically connect the semiconductor die to the patterned conductive layer by means of conductive bumps.

In another embodiment of the invention, conductive bumps 54 are employed in lieu of bond wires 26, to provide a conductive path from the die pad 20 to the conductive layer 14, as illustrated in FIG. 9. The bumps, which may be made of gold, copper or solder, are formed and joined by a tape automated bonding (TAB) process, which is well known in the art. The use of the bumps reduces the space required for the bond wires. By virtue of the elimination of bond wires, the assembly provides a more compact package and allows a relatively high lead count, because there is no physical space limitation by a molded enclosure as found in the prior art.

Figure 10:
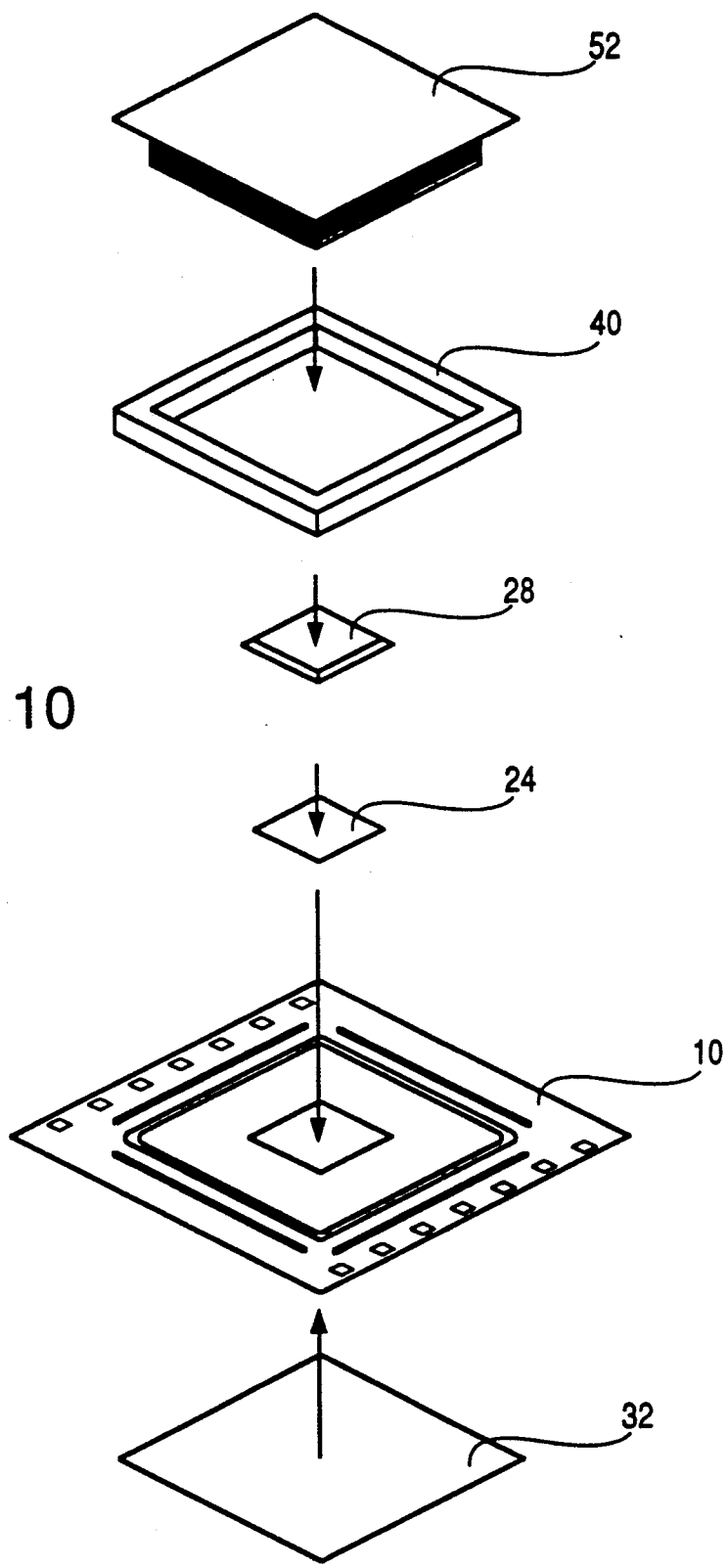
FIG. 10 is an exploded view of the semiconductor device package of this invention.

With reference to FIG. 10, the exploded view of the semiconductor device package of this invention shows the body frame 40, which has a vertical dimension, which may be approximately 60 milli-inches for example, and the epoxy encapsulant body 52 as they relate to the wire bondable tape. The assembly does not include a molded package surrounding the semiconductor elements and does not incorporate a conductive patterned lead frame which is part of the electrically conductive path. The body frame or package frame of this invention eliminates the need for molding a package around the semiconductor device and may be made of plastic or nonconductive material. The body frame is used to contain the epoxy encapsulant body which provides the desired protection to the components of the semiconductor device.

Although the description herein is directed to the processing of a single unit, it should be understood that the process is applicable to produce a multiplicity of units simultaneously. Also, the invention is not limited to the materials and parameters specified herein and modifications may be made within the scope of the invention.

There has been disclosed a novel design for a semiconductor device package and a process for implementing the package design. The novel plastic package eliminates the need for a molded enclosure, is greatly reduced in height and overall area, and realizes improved electrical performance and reliability. There is virtually no problem of delamination of the insulating area, which is Kapton for example, from the conductive layer. Moisture penetration is effectively minimized. Also there is no problem of die surface corrosion.

What is claimed is:

1. An integrated circuit package comprising:
   a flexible die-supporting substrate having a metal layer and an insulative layer, where the metal layer includes lead finger portions and a die-supporting surface area separated from said lead finger portions;
   an integrated circuit die supported on the metal die-supporting surface area of the die-supporting substrate;
   a frame body having an annular cross section, the frame body being adhered to the metal layer of the die-supporting substrate with an adhesive epoxy, with the frame body surrounding the die-supporting surface area and the integrated circuit die; and
   wherein the insulative layer of the substrate includes one or more insulative dams adjacent inner or outer walls of the annular frame body for containing the adhesive epoxy.

* * * * *

UNITED STATES PATENT AND TRADEMARK OFFICE
CERTIFICATE OF CORRECTION

PATENT NO. : 5,087,961
DATED : February 11, 1992
INVENTOR(S) : Jon Long, et al

It is certified that error appears in the above-indentified patent and that said Letters Patent is hereby corrected as shown below:

Column 1, line 18, after "the" insert --same assignee--.

Column 1, line 19, delete "same assignee".

Column 1, delete "4,71,330" and insert --4,771,330--.

Column 2, line 32, after "connection" insert a period --.--.

Column 4, line 17, delete "50°" and insert in its place --cured at about 150°--.

Signed and Sealed this

Sixteenth Day of November, 1993

Attest:

BRUCE LEHMAN

Attesting Officer

Commissioner of Patents and Trademarks